(12) United States Patent
Forlenza et al.

(10) Patent No.: US 8,065,575 B2
(45) Date of Patent: Nov. 22, 2011

(54) IMPLEMENTING ISOLATION OF VLSI SCAN CHAIN USING ABIST TEST PATTERNS

(75) Inventors: Donato Orazio Forlenza, Hopewell Junction, NY (US); Orazio Pasquale Forlenza, Hopewell Junction, NY (US); Phong T Tran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 12/250,103

(22) Filed: Oct. 13, 2008

(65) Prior Publication Data

US 2010/0095169 A1   Apr. 15, 2010

(51) Int. Cl.
   *G01R 31/28* (2006.01)
(52) U.S. Cl. ........................ 714/726; 714/736
(58) Field of Classification Search .............. 714/718, 714/723, 724, 726–729, 736
   See application file for complete search history.

(56) References Cited

U.S. PATENT DOCUMENTS

| | | | |
|---|---|---|---|
| 3,761,695 A | 9/1973 | Eichelberger | |
| 5,764,655 A | 6/1998 | Kirihata et al. | |
| 5,983,380 A | 11/1999 | Motika et al. | |
| 6,308,290 B1 | 10/2001 | Forlenza et al. | |
| 6,996,760 B2 | 2/2006 | Dorsey | |
| 7,020,842 B1 | 3/2006 | DeStefano et al. | |
| 7,395,469 B2 | 7/2008 | Anderson et al. | |
| 7,434,130 B2* | 10/2008 | Huisman et al. | 714/731 |
| 2003/0036869 A1* | 2/2003 | Huisman et al. | 702/117 |
| 2004/0230882 A1 | 11/2004 | Huott et al. | |
| 2005/0138514 A1* | 6/2005 | Burdine et al. | 714/733 |
| 2010/0095177 A1 | 4/2010 | Forlenza et al. | |

FOREIGN PATENT DOCUMENTS

JP   2008082888   4/2008

OTHER PUBLICATIONS

Makar, S.R.; McCluskey, E.J.; , "Functional tests for scan chain latches," Test Conference, 1995. Proceedings., International , vol., No., pp. 606-615, Oct. 21-25, 1995 doi: 10.1109/TEST.1995.529889 URL: http://ieeexplore.ieee.org/stamp/stamp.jsp?tp=&arnumber=529889&isnumber=11600.*

Maka, S.R.; McCluskey, E.J.; , "ATPG for scan chain latches and flip-flops," VLSI Test Symposium, 1997., 15th IEEE , vol., No., pp. 364-369, Apr. 27-May 1, 1997 doi: 10.1109/VTEST.1997.600306 URL: http://ieeexplore.ieee.org/stamp/stamp.jsp?tp=&arnumber=600306&isnumber=13046.*

(Continued)

*Primary Examiner* — Cynthia Britt
(74) *Attorney, Agent, or Firm* — Joan Pennington

(57) ABSTRACT

A method, apparatus and computer program product are provided for implementing isolation of VLSI AC scan chain defects using structural Array Built In Self Test (ABIST) test patterns. An ABIST test pattern is applied to the device under test and multiple ABIST array algorithms are applied in a passing operating region and each scan chain is unloaded. The ABIST test pattern is applied to the device under test and multiple ABIST array algorithms are applied in a failing operating region for the device under test. Then the unload data from the passing operating region and the failing operating region are compared. The identified latches having different results are identified as potential AC defective latches. The identified potential AC defective latches are sent to a Physical Failure Analysis system.

20 Claims, 8 Drawing Sheets

OTHER PUBLICATIONS

Ruifeng Guo; Venkataraman, S.; , "A technique for fault diagnosis of defects in scan chains," Test Conference, 2001. Proceedings. International , vol., No., pp. 268-277, 2001 doi: 10.1109/TEST.2001. 966642 URL: http://ieeexplore.ieee.org/stamp/stamp.jsp?tp=&arnumber=966642&isnumber=20866.*

Yu Huang; Wu-Tung Cheng; Cheng-Ju Hsieh; Huan-Yung Tseng; Alou Huang; Yu-Ting Hung; , "Intermittent scan chain fault diagnosis based on signal probability analysis," Design, Automation and Test in Europe Conference and Exhibition, 2004. Proceedings , vol. 2, No., pp. 1072-1077 vol. 2, Feb. 16-20, 2004 doi: 10.1109/DATE.2004. 1269035.*

B. Konemann, J. Mucha, G. Zwiehoff, "Built-In Test for Complex Integrated Circuits", IEEE Journal of Solid State Circuits vol. SC-15, pp. 315-318, Jun. 1980.

G. A. Sarrica, B. R. Kessler "Theory and Implementation of LSSD Scan Rind & STUMPS Channel Test and Diagnosis", Sep. 28-3-, 1992, Electronics Manufacturing Technology Symposium, 1992I, Thirteenth IEEE/CHMT International, pp. 195-200.

R. Guo, S. Venkataraman, A Technique for Fault Diagnosis of Defects in Scan Chains, IEEE, paper 10.2, 2001 pp. 268-277, USA.

I. Bayraktaroglu et al., "Gate Level Fault Diagnosis in Scan-Based BIST," Proceedings of the 2002 Design Automation and Test in Europe Conference, 1530-1591/02 IEEE.

* cited by examiner

IMPLEMENTING ISOLATION OF VLSI SCAN CHAIN USING ABIST TEST PATTERNS

FIELD OF THE INVENTION

The present invention relates generally to the field of testing integrated circuits, and more particularly, relates to a method, apparatus and computer program product for implementing isolation of very-large-scale integration (VLSI) AC scan chain defects using structural Array Built In Self Test (ABIST) test patterns.

RELATED APPLICATION

A related United States patent application assigned to the present assignee is being filed on the same day as the present patent application as follows:

U.S. patent application Ser. No. 12/250,085, by Donato Orazio Forlenza et al., and entitled "IMPLEMENTING DIAGNOSIS OF TRANSITIONAL SCAN CHAIN DEFECTS USING LBIST TEST PATTERNS."

DESCRIPTION OF THE RELATED ART

Logic level testing of a system at IBM during development of the final manufacturing process of integrated circuits, for example, used in the mainframe activities of the company has been developed since the 1970's, such as disclosed in, Eichelberger, "Method of Level Sensitive Testing a Functional Logic System," U.S. Pat. No. 3,761,695 issued Sep. 25, 1973, Kirihata et al.: "Built in Self Test with Memory," U.S. Pat. No. 5,764,655 issued Jun. 9, 1998, Motika et al., "Weighted Random Pattern Built-in Self-Test," U.S. Pat. No. 5,983,380 issued Nov. 9, 1999, Forlenza et al., "Look Ahead Scan Chain Diagnostic Method," U.S. Pat. No. 6,308,290 issued Oct. 23, 2001; and Anderson et al., "Method for Implementing Deterministic Based Broken Scan Chain Diagnostics," U.S. Pat. No. 7,395,469 issued Jul. 1, 2008.

Diagnosing transitional, delay or AC scan chain defects and rapidly localizing the defects to a failing Shift Register Latch (SRL) remains a difficult and continuing problem for VLSI testing. Typically the problem is encountered early in a technology life cycle and diagnostics is critical for improving the VLSI fabrication process so that manufacturing yield levels can be quickly achieved. An inability to improve the technology and yield of the device can greatly impact a program or at least severely minimize the revenue that could be realized. Rapid diagnosis to a specific location for Physical Failure Analysis (PFA) is needed to understand and correct the process anomalies.

A need exists for a fast and efficient method for implementing isolation or diagnostics of transitional, delay or AC scan chain defects and that provides a defect location for Physical Failure Analysis (PFA).

SUMMARY OF THE INVENTION

Principal aspects of the present invention are to provide a method, apparatus and computer program product for implementing isolation of very-large-scale integration (VLSI) transitional, delay or AC scan chain defects. Other important aspects of the present invention are to provide such method, apparatus and computer program product are provided for implementing isolation of VLSI transitional, delay or AC scan chain defects substantially without negative effect and that overcome many of the disadvantages of prior art arrangements.

In brief, a method, apparatus and computer program product are provided for implementing isolation of very-large-scale integration (VLSI) AC scan chain defects using structural Array Built In Self Test (ABIST) test patterns. An ABIST test pattern is applied to the device under test and multiple system clock sequences are applied in a passing operating region and a failing operating region for the device under test. Then each scan chain is unloaded and the unload data from the passing operating region and the failing operating region are compared. The identified latches having different results are identified as potential AC defective latches. The identified potential AC defective latches are sent to a Physical Failure Analysis system.

In accordance with feature of the invention, the device under test is tested using ABIST patterns across multiple frequencies and voltage conditions. The passing operating region includes multiple frequencies above a predefined voltage and the failing operating region includes multiple frequencies below a predefined voltage. The failing operating region includes a predefined region where the device fails due to timing or voltage.

In accordance with feature of the invention, a scan unload data comparison is performed using a good machine simulator (GMS) to identify a latch causing a transitional scan chain failure.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
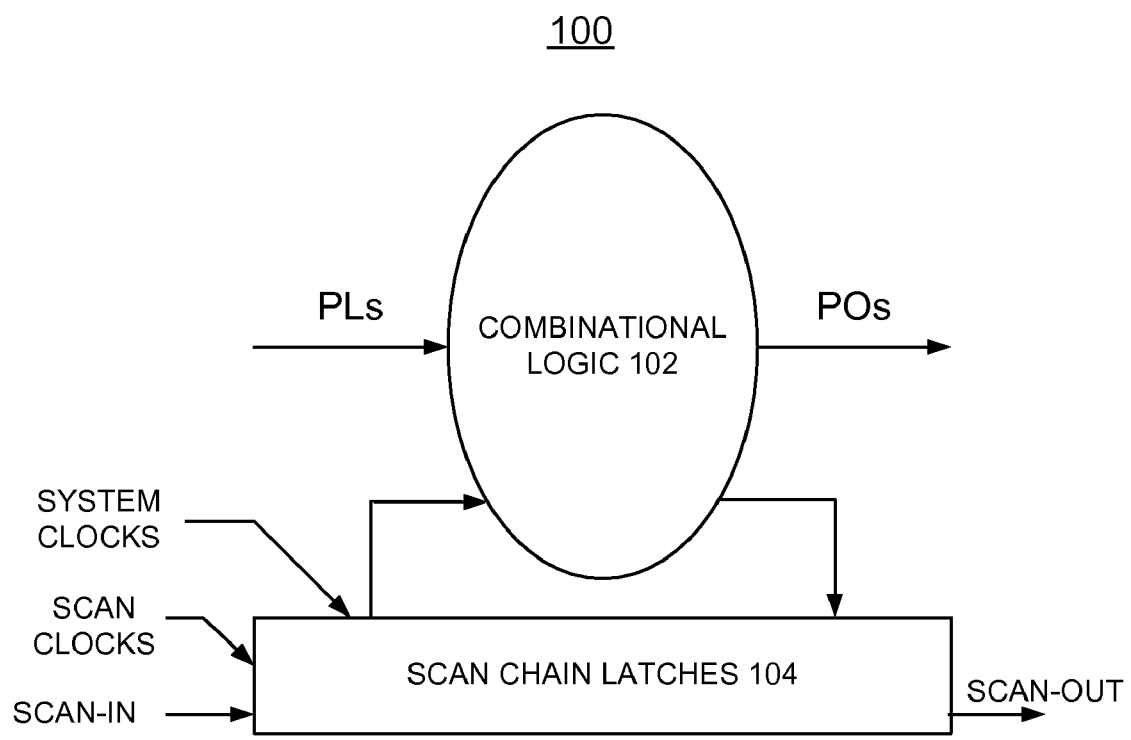
FIGS. 1, 2, 3 and 4 are block diagrams of exemplary scan chain arrangements for use in accordance with the preferred embodiment.

In accordance with features of the invention, a method is provided that utilizes structural Array Built In Self Test (ABIST) test patterns for diagnostics of very-large-scale integration (VLSI) transitional, delay or AC scan chain defects.

Referring now to FIGS. 1, 2, 3, and 4, there are shown exemplary scan chain arrangements generally designated by the reference characters 100, 200, 300, 400 for use in accordance with the preferred embodiment. The LSSD methodology is a system design and a Design-For-Test (DFT) approach that incorporates several basic test concepts including a scan design.

Figure 2:
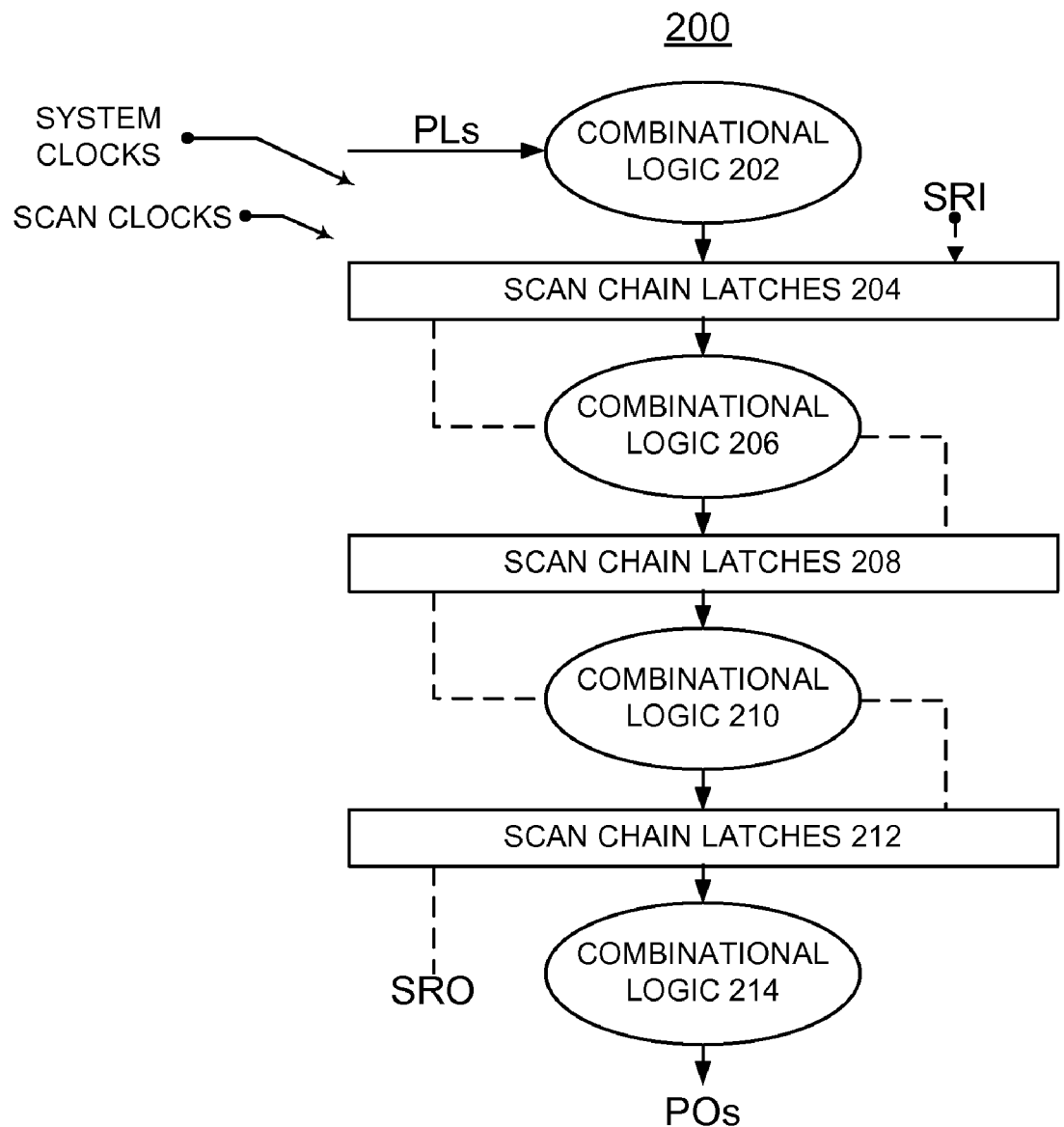

FIGS. 1 and 2 respectively illustrate a typical LSSD structure 100 and a typical LSSD configuration 200. LSSD structure 100 includes combinational logic 102 having applied primary inputs (PIs) and providing primary outputs (POs) and coupled to a scan chain latches block 104. The scan chain latches block 104 having applied system clocks and scan clocks, receives a scan chain input SCAN-IN and provides a scan chain output SCAN-OUT.

LSSD configuration 200 includes a first combinational logic and memory block 202 having applied primary inputs (PIs) and coupled to a first scan chain latches block 204. A second combinational logic and memory block 206 receives primary outputs (POs) from the first scan chain latches block 204 and is coupled to a second scan chain latches block 208. The second scan chain latches block 208 is coupled to a third combinational logic and memory block 210. The third combinational logic and memory block 210 is coupled to a scan chain latches block 212. A fourth combinational logic and memory block 214 receives primary outputs (POs) from the third scan chain latches block 212 and provides primary outputs (POs). In the typical LSSD configuration 200 most of the storage elements of the device, such as latches or registers are concatenated in one or more scan chains 204, 208 212 and can be externally accessible via one or more serial inputs (SRI) and outputs (SRO). Storage elements that are not in this category are usually memory or other special macros that are isolated and tested independently. The LSSD design methodology ensures that all logic feedback paths are gated by one or more of the storage elements, thereby simplifying a sequential design into subsets of combinational logic sections.

Figure 3:
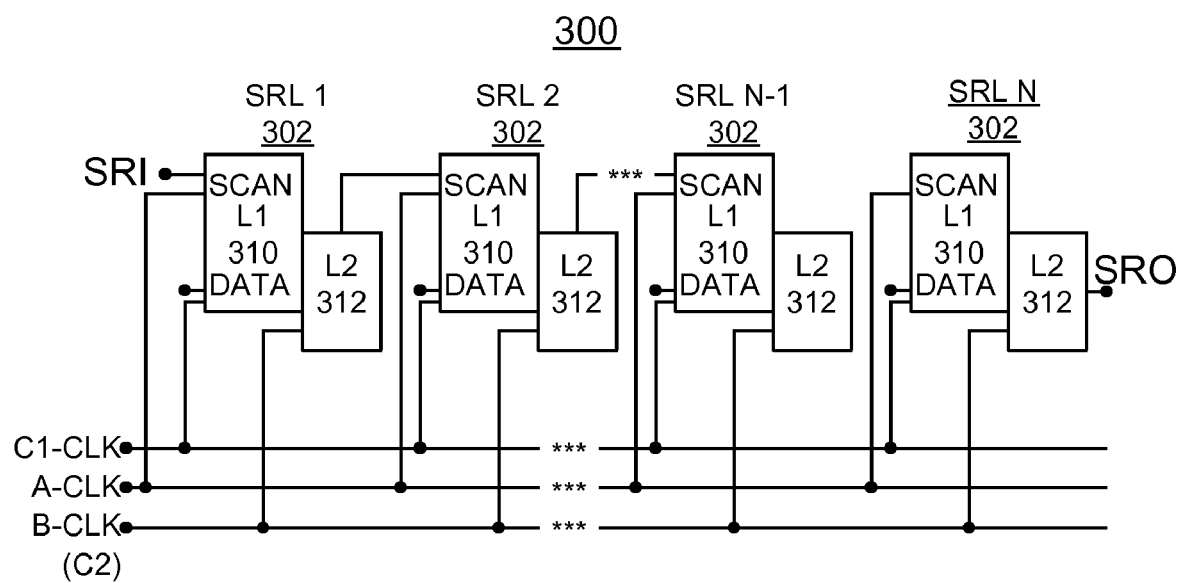

FIG. 3 illustrates a typical LSSD scan chain 300 including a chain of Shift Register Latches (SRLs), 302 SRL1-SRLN, each including a master latch L1, 310 and a slave latch L2, 312. The master latch L1, 310 has a pair of data ports SCAN and DATA, that may be captured by the latch responsive either to a first scan clock A CLK or a first functional system clock C1 CLK. The slave latch L2, 312 captures the value stored in the master latch L1, 310 responsive to either a second scan clock B CLK or a second functional system clock C2 CLK. As shown in FIG. 3, the second scan clock B CLK and the second functional system clock C2 CLK are combined as a single clock signal B CLK (C2). The second scan clock B CLK and the second functional system clock C2 CLK are typically driven out of phase with both the first scan clock A CLK and the first functional system clock C1 CLK applied to the master latch L1, 310.

Figure 4:
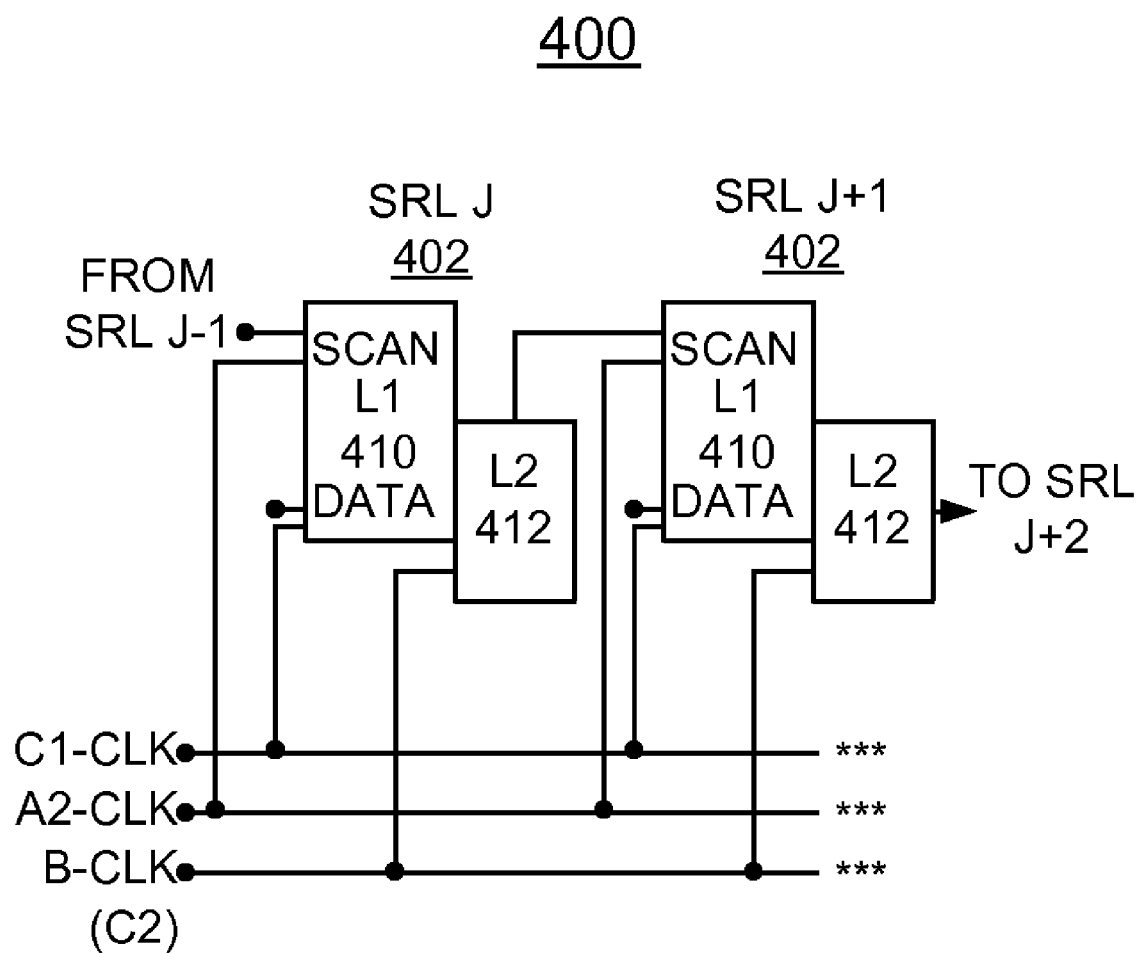

FIG. 4 illustrates a typical LSSD SRL configuration 400 including a first Shift Register Latch (SRL), 402 SRL j and a second Shift Register Latch (SRL), 402, SRL j+1, each including a master latch L1, 410 and a slave latch L2, 412. The first Shift Register Latch (SRL), 402 SRL j has a scan input connected from a prior SRL j−1 (not shown) and the second Shift Register Latch (SRL), 402, SRL j+1 provides a scan input to a next SLR j+2 (not shown), with the other scan input connected to scan clock A2 CLK for both the first and second SRLs 402, SRL j and SRL j+1. The combined second scan clock B CLK and the second functional system clock C2 CLK or the single clock signal B CLK (C2) is applied to the slave latch L2, 412.

In accordance with features of the invention, an available Array-Built-In-Self-Test (ABIST) engine that typically is essential in testing arrays in most very-large-scale integration (VLSI) designs, is used in diagnosing delay or AC scan chain defects.

The ABIST engine typically tests each address space by writing and reading specific test algorithms. Some test algorithms include multiple unique address ripple word, unique address ripple bit, word line stripe, and checkerboard. The ABIST engine is a highly programmable engine and is capable of applying many different pattern sets. The ABIST engine is comprised of microcode instructions which controls the address counter, data generator, and writing to the array. The ABIST engine exercises the arrays during test similar to the manner in which it is operated functionally. The ABIST circuitry allows high speed testing of the arrays. Once an initialization is performed to initialize the ABIST circuitry, there is no requirement to force a state on any input or output pin to the device since the ABIST circuitry controls the address, data, and control information to the arrays. The number of clocks needed to complete the array testing is dependent on the size and type of array.

The results are typically compressed in a Multiple-Input-Shift Register (MISR) or placed in a latch then scanned-out via the shift registers. The results can be used for diagnostics purposes to identify fail cycles or scan out results after the test completes.

In accordance with features of the invention, ABIST test patterns are empirically derived on chip to solve the problem of diagnosing delay or AC scan chain defects. A novel method is provided that efficiently utilizes a self-contained and exhaustive diagnostic test pattern suite of ABIST test patterns that sensitize and pinpoint the exact AC defective latch within the scan chain of interest. A transition fault models delay or AC defects and is defined as a defect that delays either a rising, slow-to-rise (STR) or falling, slow-to-fall, (STF) transition on any input or output of a logic gate. There are two separate and distinct consecutive patterns that are required in order to successfully detect a transition fault. The first pattern sets up or places the initial transition value at the point of the fault. The second pattern places the final transition value at the point of the fault and propagates the effect to a timed measurable observation point.

Figure 7:
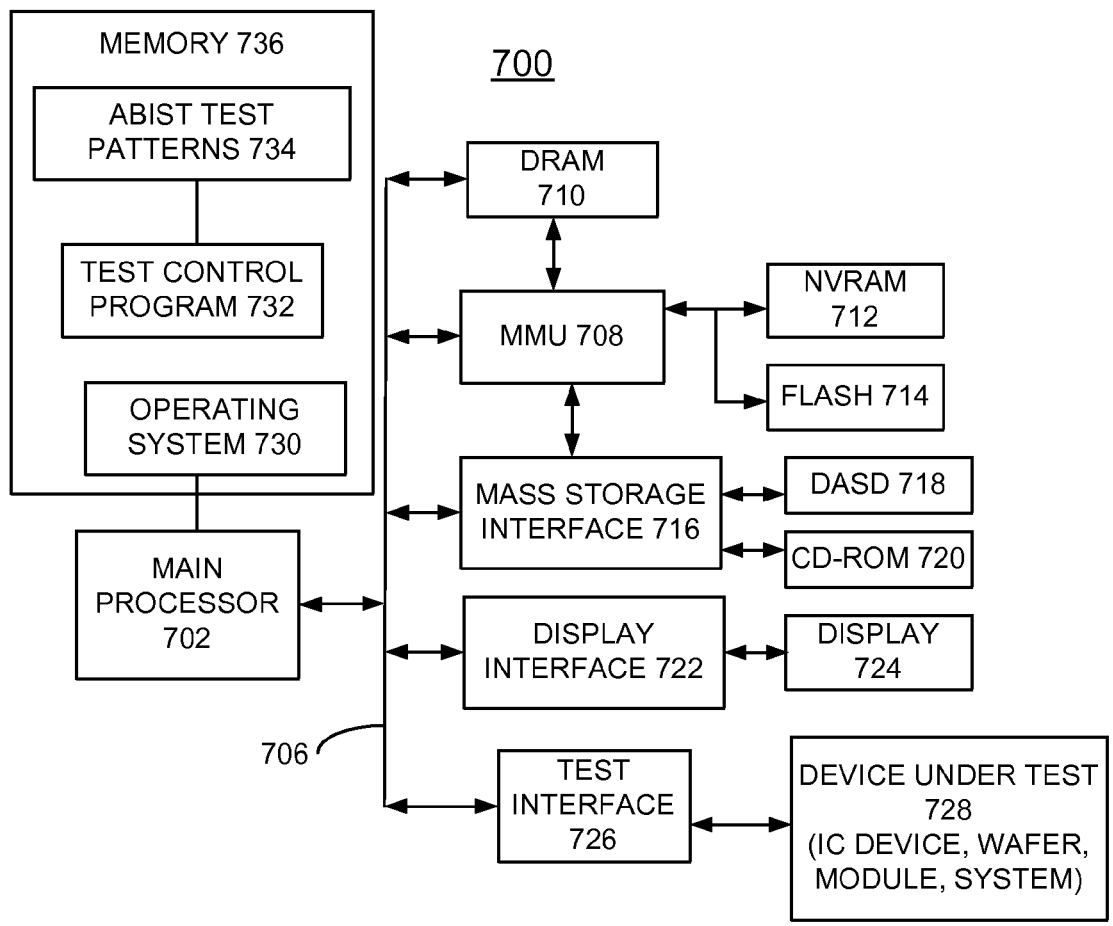
FIG. 7 is a block diagram representations illustrating an exemplary computer test system for implementing diagnostics of very-large-scale integration (VLSI) transitional, delay or AC scan chain defects using structural Array Built In Self Test (ABIST) test patterns in accordance with the preferred embodiment.

In accordance with features of the invention, a test control program 732 of a test system 700 of FIG. 7 defines an ABIST engine used in diagnosing delay or AC scan chain defects to repeatedly and randomly broadside stimulate all the latches in the scan chains to isolate the failing Relative Measure Latches or RMLs. This comprehensive latch perturbation, in conjunction with iterative ABIST diagnostic algorithms is used to identify and pinpoint the AC defective latch in the scan chain.

Figure 6:
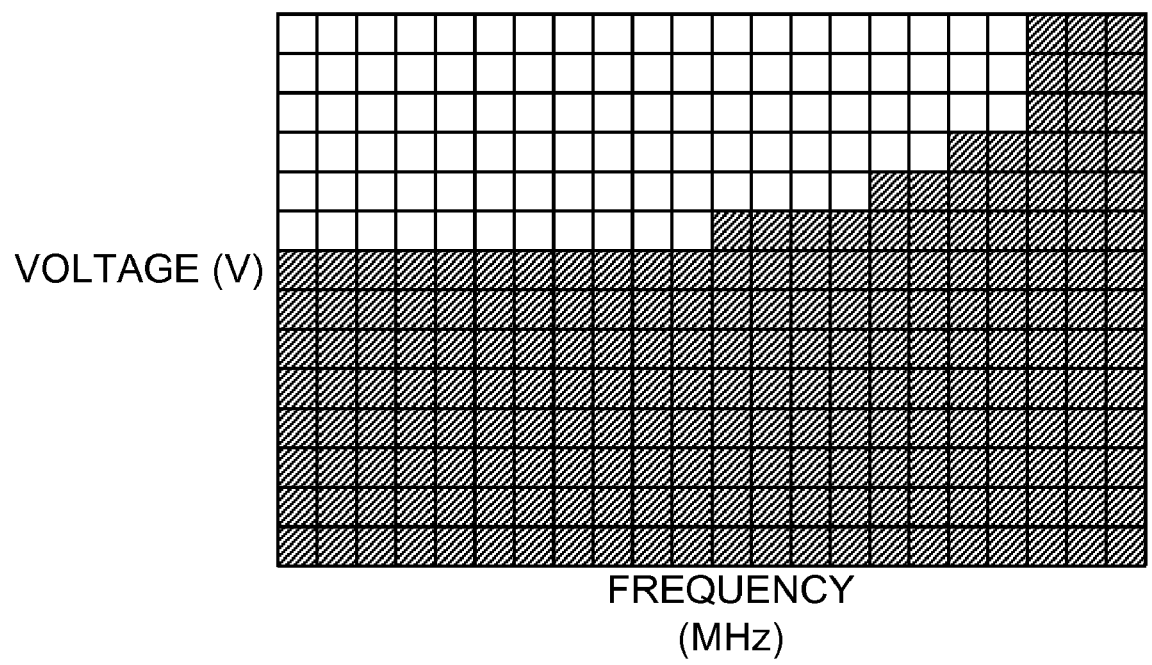
FIG. 6 is a diagram illustrating exemplary voltage and frequency values utilized for diagnostics of very-large-scale integration (VLSI) transitional, delay or AC scan chain defects using structural Array Built In Self Test (ABIST) test patterns in accordance with the preferred embodiment.

In accordance with features of the invention, ABIST patterns are used for exercising the device logic under test as delay or AC scan chain diagnostic patterns. Functional system clocks in ABIST chip configuration mode are applied in a broadside lateral insertion manner, as opposed to sensitization via the scan path, such as to expose the AC defect in what is referred to as the bad or failing operating region. Also a good or passing operating region under different test conditions is determined. This is illustrated via a voltage or frequency timing control as shown in FIG. 6 with the bad region shown in cross-hash portion. In order to isolate an AC defect, the scan chains are unloaded for each LSSD latch for both a passing and a failing operating point. Subsequently, a simple off-line comparison of the unload data for each operating point is performed and hence, the differing latches are identified. These differing latches are then stored and sent to PFA. The process of the invention advantageously is automated and used in a manufacturing environment. Some latches typically are expected to differ due to a combination of logic/array, power-up, and unstable latch conditions. These latch types are characterized and identified prior to the diagnostic process and can be simply cross-referenced against the diagnostic latch calls obtained via this process. These latches are then excluded from a final list of suspect AC defective latch calls for submission to PFA. Therefore, the AC defective SRLs are then identified as the SRLs that differ between the unload data of a good operating region and a bad operating region without the identified unstable latches.

In accordance with features of the invention, two modes of unload data comparison can be used in this diagnostic process. The first approach using off-line techniques includes logging all the desired unload data during the test execution and then comparing the unload data to previously generated good unload data. The good unload data generation depends on the type of test and diagnostic problem being addressed.

For example, the representative unload data are generated prior to test via a good machine simulator (GMS) and stored on the tester or computer test system. This may require relatively large unload data storage capacity on the tester, but needs to be performed only once. If an interactive GMS is readily available during test, the storage problem can be significantly reduced.

Another or second approach, which is very powerful in some situations, is to used the same device under test to generate the good reference unload data. This can be accomplished when the device has an operating range that is functioning properly. Also this operating range might be at a slightly different voltage or timing conditions.

Figure 5:
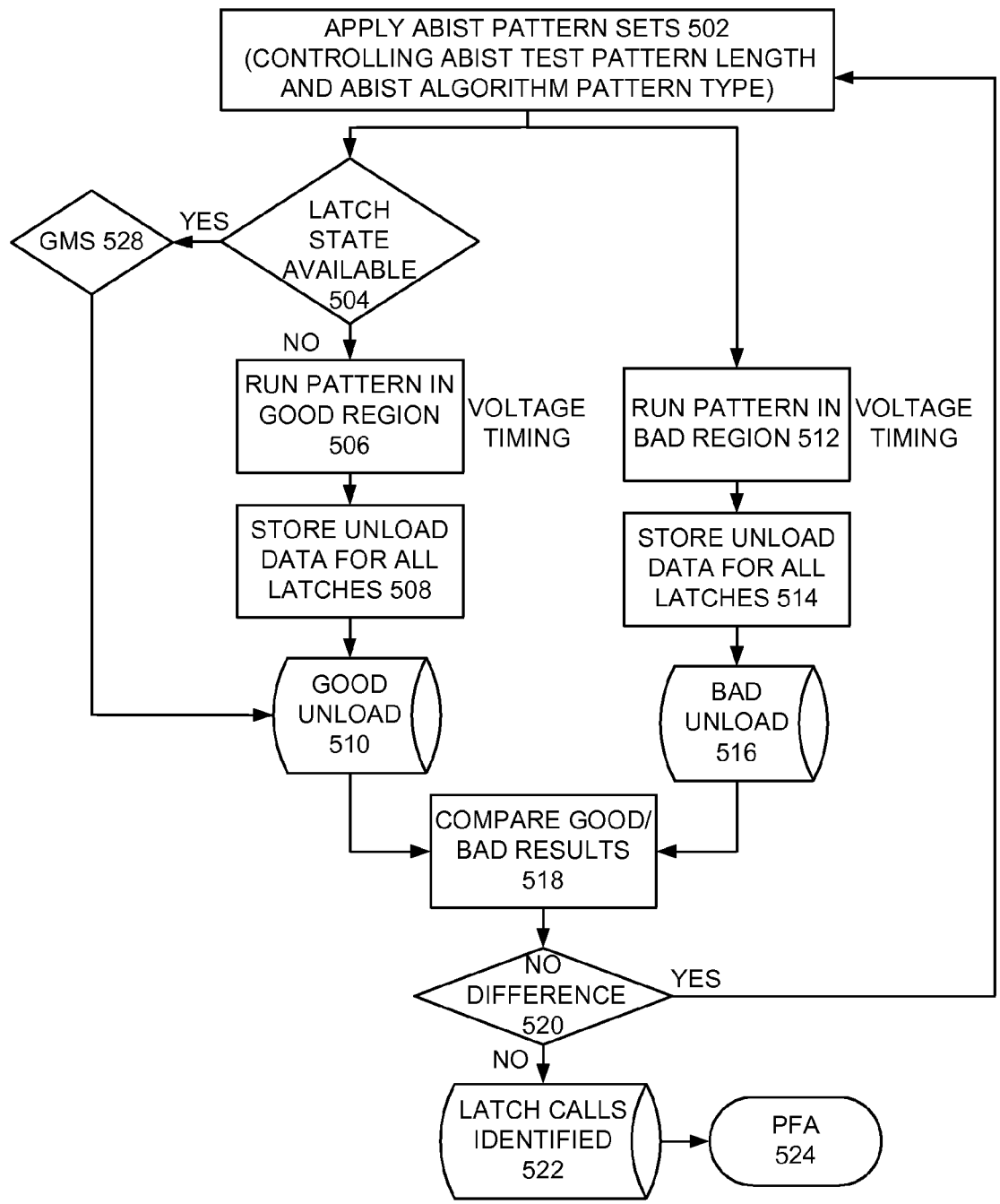
FIG. 5 is a flow chart illustrating exemplary steps for implementing diagnostics of very-large-scale integration (VLSI) transitional, delay or AC scan chain defects using structural Array Built In Self Test (ABIST) test patterns in accordance with the preferred embodiment.

Referring now to FIG. 5, there are shown exemplary steps for implementing diagnostics of transitional, delay or AC scan chain defects using structural Array Built In Self Test (ABIST) test patterns in accordance with the preferred embodiment.

Different ABIST test patterns are applied to a device under test. A given ABIST pattern and multiple ABIST array algorithms are applied to the device under test as indicated at a block 502 with controlling the ABIST test pattern length and ABIST algorithm pattern type. By varying the timing and voltage 5 parameters, as well as controlling the total ABIST test pattern length and ABIST algorithm pattern type, such as blanket 0/1, checkerboard, march, walk, bit line stripe, word line stripe, n-squared, and the like, one may generate the necessary transitions that will allow the AC defect to be sensitized and observed within a latch. These transitions include slow-to-rise (STR) and slow-to-fall (STF) and an extensive or robust ABIST test pattern suite ensures that the AC defect will be identified and pinpointed to a specific latch for successful PFA.

This method can be extended to other ABIST test pattern modes, types, and methodologies in the pursuit of causing numerous transitions at the latch boundaries to expose the AC fail. By utilizing many ABIST test patterns to serve as the basis for the AC diagnostic pattern set, which targets different portions of the structure being diagnosed via the arrays, the probability of causing the required transitions necessary to expose the AC defect is significantly improved so that AC diagnostic latch isolation and resolution is thereby improved. This AC diagnostic method can be employed at the wafer, module, and higher level packages. However, it is usually more cost effective to perform the diagnostics at the wafer level to speed fabrication process and tool corrections, correct design marginality, and improve product wafer yields, especially during early technology introduction.

Multiple ABIST pattern sets can be applied at block 502 depending upon the specific design being diagnosed. Multiple ABIST array algorithms present different data at the functional ports of the scan chain latches. Each ABIST array algorithm will potentially provide enough random data so that each sequence will equally insert a "1" or "0" into each latch via the function or system port.

In accordance with features of the invention, the data results are analyzed to identify the shift register latch (SRL) at which the ABIST good operating region unload data differs from the ABIST bad operating region unload data. This scan pattern generation and diagnostic process should consider all latch inversions within the scan chains. The ABIST methodology tests many different macros on the device and it may be possible to further minimize dependencies on other long chain interactions. Some ABIST patterns may only use a few SR chains to test a specific macro. Before the SRs are unloaded the device may or may not be reconfigured to multiple scan chain modes. This is usually done to minimize the dependency on one single long chain and for improved diagnostic granularity during the diagnostic process. The varieties of the ABIST test pattern set generate test vectors that will be latched into the system data ports of the SRLs. Executing different ABIST tests for all the macros can sensitize different functional paths that are observed at SRLs. If a 0 and a 1 is captured in almost every latch for each SR it will be a complete solution and a powerful tool. Executing more ABIST tests will further enhance, identify, and pinpoint exactly where the AC sensitivity condition begins for the various SR unloads. It is approximated that a significant number of SRLs will switch to a 0 or 1 during the execution of the ABIST patterns.

Checking for available latch state is performed as indicated at a decision block 504. When available latch state is not available, then the ABIST pattern is run in a good region for the device under test.

Referring also to FIG. 6, there are shown exemplary voltage and frequency values utilized for diagnostics of transitional, delay or AC scan chain defects using structural Array Built In Self Test (ABIST) test patterns in accordance with the preferred embodiment. FIG. 6 illustrates as an example, a passing operating region without shading and a failing region indicated by cross-hatching.

The device under diagnostics is tested using ABIST patterns across many frequencies and voltage conditions at block 506. The device under diagnostics is tested in the passing or good region and all its latches are dumped with unload data stored for all latches as indicated at a block 508. The good region stored data is indicated at a block 510.

Similarly, the device is tested in the failing or bad region and the latches are dumped. A bad region is one where the device fails due to timing or voltage. FIG. 6 illustrates a passing region that is generally above 0.9 Volts and a failing region generally below 0.9 Volts within a selected frequency range.

The ABIST pattern is run in a failing or bad region for the device under test as indicated at a block 512. The device under diagnostics is tested in the failing or bad region and all its latches are dumped with unload data stored for all latches as indicated at a block 514. The bad region stored unload data is indicated at a block 516.

In accordance with features of the invention, the SRLs of the device under diagnostics is dumped anywhere in the failing region as well as anywhere in the passing region. A comparison is done to identify the latch causing the scan chain to fail.

The unload data from the good and bad region are compared as indicated at a block 518. Then in accordance with features of the invention the latches that are different or miss-compare are reported. These miss-compare latches are potential candidates for where the AC defect lies within the scan chain.

A simple off-line comparison of these data unloads for each operating point is performed and hence, the differing latches are identified at block 518. When no difference is identified as indicated at a decision block 520, then another ABIST pattern is applied returning to block 502. Otherwise the differing latches are then stored as indicated at a block 522 and sent to a Physical Failure Analysis system (PFA) as indicated at a block 524.

When the latch state is available at decision block 204, then a scan unload data comparison is performed using a good machine simulator (GMS) as indicated at a decision block 528 that is stored on the tester or system under test, and the result stored with the good region unload data at block 510.

Some latches might be expected to differ at compare block 528, for example, due to a combination of logic/array, power-up, and unstable latch conditions. These latch types are characterized and identified prior to the diagnostic process and can be simply cross-referenced against the diagnostic latch calls obtained via this process at block 522. These latches advantageously are excluded from the final list of suspect AC defective latch calls for submission to PFA at block 522. Therefore, the AC defective SRLs are then identified as the SRLs that differ between the unload data of the good and bad operating region minus these unstable latches.

In accordance with features of the invention, the method for diagnostics of transitional, delay or AC scan chain defects using structural Array Built In Self Test (ABIST) test patterns advantageously is automated and used in a manufacturing environment.

In FIG. 7 there is shown an exemplary computer test system generally designated by the reference character 700 for implementing ABIST scan chain diagnostics in accordance with the preferred embodiment. Computer system 700 includes a main processor 702 or central processor unit (CPU) 702 coupled by a system bus 706 to a memory management unit (MMU) 708 and system memory including a dynamic random access memory (DRAM) 770, a nonvolatile random access memory (NVRAM) 712, and a flash memory 714. A mass storage interface 716 coupled to the system bus 706 and MMU 708 connects a direct access storage device (DASD) 718 and a CD-ROM drive 720 to the main processor 702. Computer system 700 includes a display interface 722 connected to a display 724, and a test interface 726 coupled to the system bus 706. A device under test 728 is coupled to the test interface 726. The device under test 728 includes, for example, an integrated circuit wafer, a module, or a system. Computer system 700 includes an operating system 730, a test control program 732, and a set of ABIST test patterns 734 of the preferred embodiment resident in a memory 736.

Computer test system 700 is shown in simplified form sufficient for understanding the present invention. The illustrated computer test system 700 is not intended to imply architectural or functional limitations. The present invention can be used with various hardware implementations and systems and various other internal hardware devices, for example, multiple main processors.

Figure 8:
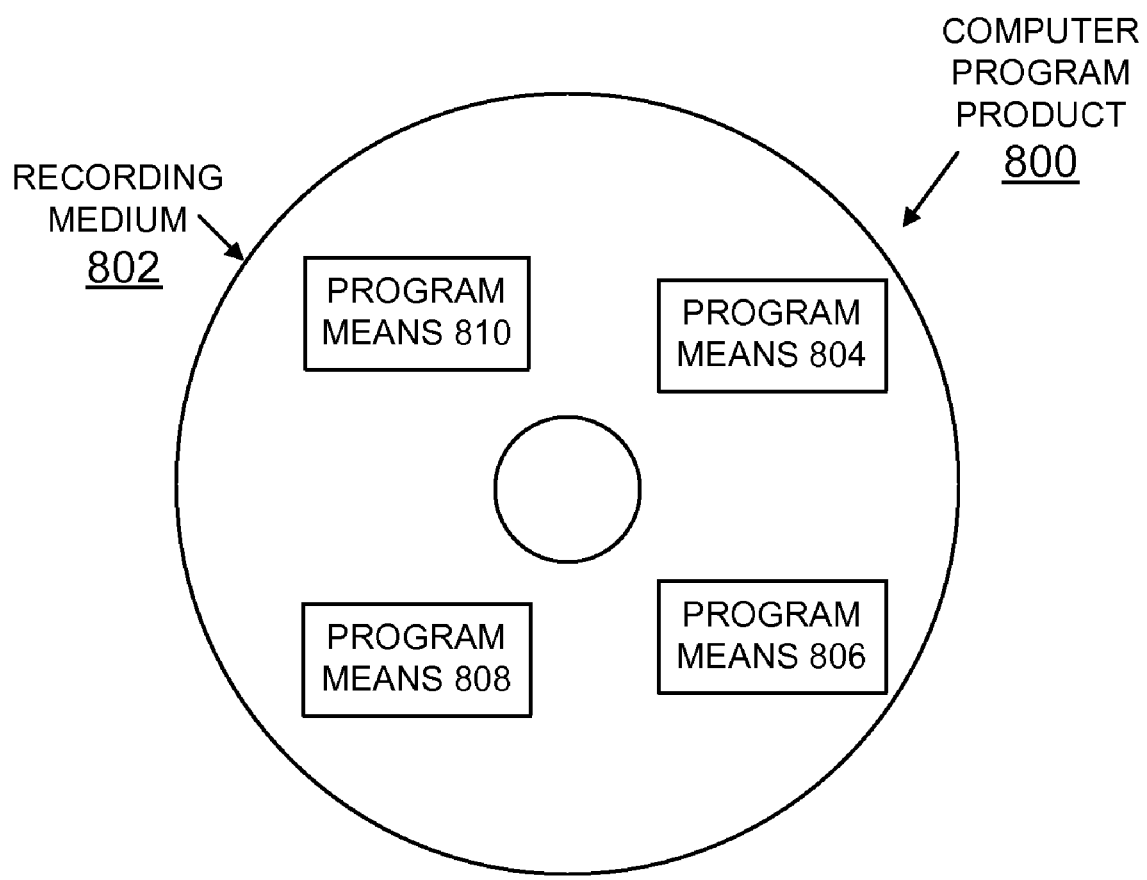
FIG. 8 is a block diagram illustrating a computer program product in accordance with the preferred embodiment.

Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, or another similar computer program product. Recording medium 802 stores program means 804, 806, 808, 810 on the medium 802 for carrying out the methods for implementing diagnostics of transitional, delay or AC scan chain defects of the preferred embodiment in the system 700 of FIG. 7.

A sequence of program instructions or a logical assembly of one or more interrelated modules defined by the recorded program means 804, 806, 808, 810, direct the computer system 700 for implementing diagnostics of transitional, delay or AC scan chain defects of the preferred embodiment.

While the present invention has been described with reference to the details of the embodiments of the invention shown in the drawing, these details are not intended to limit the scope of the invention as claimed in the appended claims.

What is claimed is:

1. A method for implementing isolation of very-large-scale integration (VLSI) AC scan chain defects using structural Array Built In Self Test (ABIST) test patterns comprising the steps of:

using a voltage and frequency timing control and determining a passing operating region and a failing operating region for the device under test;

applying an ABIST test pattern to the device under test and applying multiple ABIST array algorithms and varying voltage and frequency timing parameters in the passing operating region for the device under test and unloading scan chain data;

applying the ABIST test pattern to the device under test and applying multiple ABIST array algorithms and varying voltage and frequency timing parameters in the failing operating region for the device under test and unloading scan chain data;

comparing the unload data from the passing operating region and the failing operating region;

identifying each latch having different results as a potential AC defective latch; and sending the identified potential AC defective latches to a Physical Failure Analysis system.

2. The method for implementing isolation of VLSI AC scan chain defects using structural Array Built In Self Test (ABIST) test patterns as recited in claim 1 includes wherein comparing the unload data from the passing operating region and the failing operating region includes identifying consistent results, selecting another ABIST test pattern; and repeating the testing steps.

3. The method for implementing isolation of VLSI AC scan chain defects using structural Array Built In Self Test (ABIST) test patterns as recited in claim 1 includes performing a scan unload data comparison of unload data from the passing operating region with a good machine simulator (GMS) to identify a latch causing a transitional scan chain failure.

4. The method for implementing isolation of VLSI AC scan chain defects using structural Array Built In Self Test (ABIST) test patterns as recited in claim 1 wherein the steps of applying the ABIST test pattern to the device under test and applying multiple ABIST array algorithms includes repeatedly and randomly broadside stimulating all latches in the scan chains to isolate a failing Relative Measure Latch (RML).

5. The method for implementing isolation of VLSI AC scan chain defects using structural Array Built In Self Test (ABIST) test patterns as recited in claim 1 wherein the steps of applying the ABIST test pattern to the device under test and applying multiple ABIST array algorithms includes varying frequency and voltage parameter for the device under test.

6. The method for implementing isolation of VLSI AC scan chain defects using structural Array Built In Self Test (ABIST) test patterns as recited in claim 1 wherein the steps of applying the ABIST test pattern to the device under test and applying multiple ABIST array algorithms includes controlling a total ABIST test pattern length and an ABIST algorithm pattern type.

7. The method for implementing isolation of VLSI AC scan chain defects using structural Array Built In Self Test (ABIST) test patterns as recited in claim 1 wherein the passing operating region includes multiple operating frequencies above a predefined operating voltage.

8. The method for implementing isolation of VLSI AC scan chain defects using structural Array Built In Self Test (ABIST) test patterns as recited in claim 1 includes wherein the failing operating region includes multiple operating frequencies below a predefined operating voltage.

9. An apparatus for implementing isolation of VLSI AC scan chain defects using structural Array Built In Self Test (ABIST) test patterns comprising:
   an ABIST test pattern set;
   a test control program using a voltage and frequency timing control and determining a passing operating region and a failing operating region for the device under test; applying an ABIST test pattern to the device under test and applying multiple ABIST array algorithms and varying voltage and frequency timing parameters in the passing operating region for the device under test and unloading scan chain data; applying the ABIST test pattern to the device under test and applying multiple ABIST array algorithms and varying voltage and frequency timing parameters in the failing operating region for the device under test and unloading scan chain data; comparing the unload data from the passing operating region and the failing operating region; identifying each latch having different results as a potential AC defective latch; and sending the identified potential AC defective latches to a Physical Failure Analysis system.

10. The apparatus for implementing isolation of VLSI AC scan chain defects using structural Array Built In Self Test (ABIST) test patterns as recited in claim 9 wherein said test control program selects another ABIST test pattern, responsive to comparing the unload data from the passing operating region and the failing operating region and identifies consistent results.

11. The apparatus for implementing isolation of VLSI AC scan chain defects using structural Array Built In Self Test (ABIST) test patterns as recited in claim 9 wherein said test control program performs a scan unload data comparison of unload data from the passing operating region with a good machine simulator (GMS) to identify a latch causing a transitional scan chain failure.

12. The apparatus for implementing isolation of VLSI AC scan chain defects using structural Array Built In Self Test (ABIST) test patterns as recited in claim 9 wherein said test control program repeatedly and randomly broadside stimulates all latches in the scan chains to isolate a failing Relative Measure Latch (RML) with applying the ABIST test pattern to the device under test.

13. The apparatus for implementing isolation of VLSI AC scan chain defects using structural Array Built In Self Test (ABIST) test patterns as recited in claim 9 wherein said test control program controls a total ABIST test pattern length and an ABIST algorithm pattern type with applying the ABIST test pattern to the device under test.

14. The apparatus for implementing isolation of VLSI AC scan chain defects using structural Array Built In Self Test (ABIST) test patterns as recited in claim 9 wherein the passing operating region includes multiple operating frequencies above a predefined voltage.

15. The apparatus for implementing isolation of VLSI AC scan chain defects using structural Array Built In Self Test (ABIST) test patterns as recited in claim 9 wherein the failing operating region includes multiple operating frequencies below a predefined voltage.

16. A computer program product for implementing isolation of VLSI AC scan chain defects using structural Array Built In Self Test (ABIST) test patterns in a device under test in a computer test system, said computer program product including instructions stored on a computer recording medium consisting one of a floppy disk, an optically read compact disk, a compact disk read only memory (CD-ROM), and a tape, wherein said instructions, when executed by the computer test system to cause the computer system to perform the steps of:
   using a voltage and frequency timing control and determining a passing operating region and a failing operating region for the device under test;
   applying an ABIST test pattern to the device under test and applying multiple ABIST array algorithms and varying voltage and frequency timing parameters in the passing operating region for the device under test and unloading scan chain data;
   applying the ABIST test pattern to the device under test and applying multiple ABIST array algorithms and varying voltage and frequency timing parameters in the failing operating region for the device under test and unloading scan chain data;
   comparing the unload data from the passing operating region and the failing operating region;
   identifying each latch having different results as a potential AC defective latch; and
   sending the identified potential AC defective latches to a Physical Failure Analysis system.

17. The computer program product for implementing isolation of VLSI AC scan chain defects using structural Array Built In Self Test (ABIST) test patterns in a device under test as recited in claim 16 includes comparing the unload data from the passing operating region and the failing operating region includes identifying consistent results, selecting another ABIST test pattern; and repeating the testing steps.

18. The computer program product for implementing isolation of VLSI AC scan chain defects using structural Array Built In Self Test (ABIST) test patterns in a device under test as recited in claim 16 includes performing a scan unload data comparison of unload data from the passing operating region with a good machine simulator (GMS) to identify a latch causing a transitional scan chain failure.

19. The computer program product for implementing isolation of VLSI AC scan chain defects using structural Array Built In Self Test (ABIST) test patterns in a device under test as recited in claim 16 wherein the steps of applying the ABIST test pattern to the device under test and applying multiple ABIST array algorithms includes repeatedly and randomly broadside stimulating all latches in the scan chains to isolate a failing Relative Measure Latch (RML).

20. The computer program product for implementing isolation of VLSI AC scan chain defects using structural Array Built In Self Test (ABIST) test patterns in a device under test as recited in claim 16 wherein the steps of applying the ABIST test pattern to the device under test and applying multiple ABIST array algorithms includes controlling a total ABIST test pattern length and an ABIST algorithm pattern type.

* * * * *